(12) United States Patent
Liang et al.

(10) Patent No.: US 10,636,882 B2
(45) Date of Patent: Apr. 28, 2020

(54) METHOD FOR FORMING A SEMICONDUCTOR STRUCTURE AND A SEMICONDUCTOR STRUCTURE MANUFACTURED THEREOF

(71) Applicant: IMEC VZW, Leuven (BE)

(72) Inventors: Hu Liang, Leuven (BE); Xiuju Zhou, Heverlee (BE); Geert Eneman, Heverlee (BE)

(73) Assignee: Imec vzw, Leuven (BE)

( * ) Notice: Subject to any disclaimer, the term of this patent is extended or adjusted under 35 U.S.C. 154(b) by 0 days.

(21) Appl. No.: 16/171,627

(22) Filed: Oct. 26, 2018

(65) Prior Publication Data
US 2019/0172913 A1    Jun. 6, 2019

(30) Foreign Application Priority Data
Dec. 5, 2017 (EP) .................................... 17205577

(51) Int. Cl.
*H01L 29/76* (2006.01)
*H01L 29/20* (2006.01)
(Continued)

(52) U.S. Cl.
CPC ...... *H01L 29/2003* (2013.01); *H01L 21/0237* (2013.01); *H01L 21/0243* (2013.01);
(Continued)

(58) Field of Classification Search
CPC ............ H01L 29/2003; H01L 21/0237; H01L 21/02381; H01L 21/0243; H01L 21/02433
(Continued)

(56) References Cited

U.S. PATENT DOCUMENTS

| 7,977,703 B2 * | 7/2011 | Shakuda | H01L 21/02403 |
| | | | 257/103 |
| 2006/0266281 A1 | 11/2006 | Beaumont et al. | |

(Continued)

OTHER PUBLICATIONS

European Search Report, European Patent Application No. 17205577.4 dated Jun. 25, 2018, 10 pages.
(Continued)

*Primary Examiner* — Tan N Tran
(74) *Attorney, Agent, or Firm* — McDonnell Boehnen Hulbert & Berghoff LLP

(57) ABSTRACT

A semiconductor structure and a method for forming the semiconductor structure are provided. The method includes: providing a monocrystalline substrate having an upper surface covered with a masking layer comprising at least one opening exposing the upper surface; filling the opening by epitaxially growing therein a first layer comprising a first Group III-nitride compound; and growing the first layer further above the opening and on the masking layer by epitaxial lateral overgrowth, wherein the at least one opening has a top surface defined by three or more straight edges forming a polygon parallel to the upper surface and oriented in such a way with respect to the crystal lattice of the monocrystalline substrate so as to permit the epitaxial lateral overgrowth of the first layer in a direction perpendicular to at least one of the edges, thereby forming the semiconductor structure as an elongated structure.

19 Claims, 15 Drawing Sheets

(51) Int. Cl.
  *H01L 29/778* (2006.01)
  *H01L 29/78* (2006.01)
  *H01L 29/16* (2006.01)
  *H01L 29/66* (2006.01)
  *H01L 21/02* (2006.01)
  *H01L 33/32* (2010.01)
  *H01L 33/00* (2010.01)
  *H01L 29/04* (2006.01)
  *H01L 21/8234* (2006.01)
  *H01L 29/739* (2006.01)

(52) U.S. Cl.
  CPC .. *H01L 21/02381* (2013.01); *H01L 21/02433* (2013.01); *H01L 21/02538* (2013.01); *H01L 21/02639* (2013.01); *H01L 21/02647* (2013.01); *H01L 21/823431* (2013.01); *H01L 29/045* (2013.01); *H01L 29/16* (2013.01); *H01L 29/66462* (2013.01); *H01L 29/66795* (2013.01); *H01L 29/778* (2013.01); *H01L 29/785* (2013.01); *H01L 29/7851* (2013.01); *H01L 33/007* (2013.01); *H01L 33/0075* (2013.01); *H01L 33/32* (2013.01); *H01L 29/7391* (2013.01); *H01L 29/7786* (2013.01)

(58) Field of Classification Search
  USPC .......................................................... 257/288
  See application file for complete search history.

(56) References Cited

U.S. PATENT DOCUMENTS

2009/0098343 A1* 4/2009 Arena ................. H01L 21/0237
                                                                      428/172
2009/0159907 A1* 6/2009 Wang ..................... H01L 33/22
                                                                      257/94

OTHER PUBLICATIONS

Zheleva, Tsvetanka S. et al., Lateral Epitaxy and Dislocation Density Reduction in Selectively Grown GaN Structures, Journal of Crystal Growth, vol. 222, 2001, pp. 706-718.
Naritsuka, S. et al., "InP Layer Grown on (001) Silicon Substrate by Epitaxial Lateral Overgrowth", Japanese Journal of Applied Physics, vol. 34, No. 11A, Nov. 1, 1995, pp. L1432-L1435.

* cited by examiner

METHOD FOR FORMING A SEMICONDUCTOR STRUCTURE AND A SEMICONDUCTOR STRUCTURE MANUFACTURED THEREOF

CROSS-REFERENCE

The present application claims priority based on European application no. 17205577.4, filed Dec. 5, 2017, which is incorporated by reference in its entirety.

TECHNICAL FIELD OF THE DISCLOSURE

The present disclosure is related to the field of semiconductor manufacturing. More specifically, it is related to a method for manufacturing a Group III-N semiconductor structure and the Group III-N semiconductor structure manufactured thereof.

BACKGROUND OF THE DISCLOSURE

CMOS technology is used in semiconductor manufacturing. Due to the stringent requirements imposed over the past years in terms of density scaling, on-chip functionality, and device performance, new device alternatives, as well as the integration of new materials, are being explored.

Amongst the new materials currently explored, III-V materials attract much interest. III-V materials have a few characteristics making them better suited to some applications than Si. Such III-V material characteristics include the presence of a direct band-gap, which permits the emission of light and hence their use in light emitting diodes (LEDs) but also the detection of light and their use in light sensors; their thermal stability and high dielectric strength which makes them useful in high-power electronics (e.g. radio frequency high electron mobility transistors, RF-HEMT); and their wide band gap which has been put to use in microelectromechanical systems (MEMS). However, integration of III-V materials with Si remains a challenge.

While tunneling field effect transistors (TFET) have been attracting much attention to be one of the potential alternative devices to replace MOSFET technology in the sub-10 nm regime for low-power applications, integration of Group III-V materials as channel layer material in these devices has been the focus of research and development in the semiconductor industry.

A Group III-nitride tunnel junction, such as for example In(Ga)N/GaN tunnel junction (TJ), could be a potential candidate for the TFET application, due to the high band offset between InN and GaN and their direct band diagram. However, there are several challenges for the realization of In(Ga)N/GaN complementary TFET devices including the challenge of monolithic integration of III-N material and devices with CMOS technology and the high defects density of III-N materials when growing on Si substrates, which can dramatically increase the gate leakage of the TFET.

On the other hand, the integration Group III-V channel layer materials, the lattice mismatch between InP and In(Ga)As with Si, which is respectively of about 8% and 12%, poses a challenge. Although several growth technology options, such as aspect ratio trapping (ART), can help to make functional devices based on InGaAs/InP material systems, there are still several disadvantages that are difficult to overcome. Some of these challenges being, for example, the high cost of the TBP precursor and high flow of $NH_3$ (with high V/III ratio) to grow high-quality InP buffer increases the manufacturing cost. In addition, the poor thermal and chemical stability of InGaAs/InP makes it very difficult to integrate with other standard CMOS fabrication technologies. Furthermore, there is a high risk of contamination for the introduction of InGaAs/InP to the CMOS process line because of their chemical instability issues. Furthermore, because of the low energy bandgap of InGaAs/InP, there is high leakage from drain to Si buffer in the InGaAs/InP FINFET. Another challenge is that scaling capability and device performance improvement are limited by the material physical limitation of InGaAs/InP inside trenches. The narrower the InGaAs FIN, the less the carrier mobility.

Therefore, there is still a need in the art for methods for forming semiconductor structure for resolving some or all of these issues outlined above.

SUMMARY OF THE DISCLOSURE

It is an object of the present disclosure to provide better semiconductor structures and methods for making the same. The above objective can be accomplished by a method and a semiconductor structure according to the present disclosure.

In a first aspect, the present disclosure relates to a method for forming a semiconductor structure, the method comprising:

providing a monocrystalline substrate having an upper surface covered with a masking layer comprising at least one opening exposing the upper surface;

filling the at least one opening by epitaxially growing therein a first layer comprising a first Group III-nitride compound (by selective epitaxial growth (SEG)); and growing the first layer further above the at least one opening and on the masking layer by epitaxial lateral overgrowth (ELOG), wherein the at least one opening has a top surface defined by three or more straight edges forming a polygon parallel to the upper surface and oriented in such a way with respect to the crystal lattice of the monocrystalline substrate so as to permit the epitaxial lateral overgrowth of the first layer in a direction perpendicular to at least one of the three or more straight edges, thereby forming an elongated structure.

In some embodiments of the first aspect, the elongated structure can be formed with a predetermined width without the need for a lateral guide such as a trench.

In some embodiments of the first aspect, the elongated structure can have a low amount of defect by bending dislocations during the epitaxial lateral overgrowth step.

In some embodiments of the first aspect, the growth rate of the elongated structure does not change as much as a function of its width than the filling rate of trenches of different width. There is, therefore, less loading effect.

In some embodiments of the present disclosure, the use of thick buffers and complicated epitaxial techniques for dislocation and stress engineering typically required due to the bad wetting properties, the large lattice mismatch and the large thermal mismatch of Group III-nitrides compounds on typical substrates such as Si can be avoided. Indeed, thick buffers reduce layout efficiency.

In a second aspect, the present disclosure relates to a semiconductor structure comprising:

a monocrystalline substrate having an upper surface covered with a masking layer comprising at least one opening exposing the upper surface; and a first layer, in the at least one opening, comprising a first Group III-nitride compound, wherein the first layer extends further above the at least one opening in the form of a structure, wherein the at least one opening has a top surface defined by three or more straight edges forming a polygon parallel to the upper surface and oriented in such a way with respect to the crystal lattice of the monocrystalline substrate so as to permit the epitaxial lateral overgrowth of the first layer in a direction perpendicular to at least one of the three or more straight edges, and wherein the structure is laterally elongated in the direction perpendicular to said at least one of the edges.

In some embodiments of the second aspect, in view of the III-nitride compounds involved, the thermal and chemical stability of the devices are relatively high, which in turn can allow the use of high temperatures and a variety of chemical treatments in the subsequent CMOS process steps. The chemical stability can also provide a relatively low risk of contamination of the CMOS line.

Particular and representative aspects of the disclosure are set out in the accompanying independent and dependent claims. Features from the dependent claims may be combined with features of the independent claims and with features of other dependent claims as appropriate and not merely as explicitly set out in the claims.

The above and other characteristics, features and advantages of the present disclosure will become apparent from the following detailed description, taken in conjunction with the accompanying drawings, which illustrate, by way of example, the principles of the disclosure. This description is given for the sake of example only, without limiting the scope of the disclosure. The reference figures quoted below refer to the attached drawings.

Figure 1:
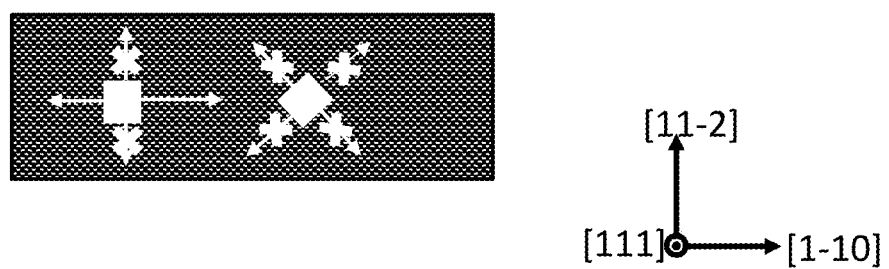
FIG. 1 shows a schematic representation corresponding to a top view of a substrate covered with a masking layer comprising two openings, one of which being oriented in accordance with an embodiment the present disclosure (left) while the other one is not (right).

In the different figures, the same reference signs refer to the same or analogous elements.

DESCRIPTION OF ILLUSTRATIVE EMBODIMENTS

The present disclosure will be described with respect to particular embodiments and with reference to certain drawings but the disclosure is not limited thereto but only by the claims. The drawings described are only schematic and are non-limiting. In the drawings, the size of some of the elements may be not drawn on scale for illustrative purposes. The dimensions and the relative dimensions do not correspond to actual reductions to practice of the disclosure.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

The term "comprising", used in the claims, should not be interpreted as being restricted to the means listed thereafter; it does not exclude other elements or steps. That is, specifying the presence of the stated features, integers, steps or components as referred to, does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various disclosed aspects. This method of disclosure, however, should not be interpreted as reflecting an intention that the disclosure requires more features than are expressly recited in each claim. Rather, as the following claims reflect, disclosed aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the disclosure.

In the description provided herein, numerous specific details are set forth. However, it is understood that embodiments of the disclosure may be practiced without these specific details. In other instances, well-known methods, structures, and techniques have not been shown in detail in order not to obscure an understanding of this description.

The following terms are provided solely to aid in the understanding of the disclosure.

As used herein and unless provided otherwise, the term "elongated structure" relates to a structure having a height perpendicular to the upper surface of the substrate and a length and a width parallel to the upper surface of the substrate, wherein the length is longer than the width, generally at least twice longer.

As used herein and unless provided otherwise, the term "Group III-nitride compound" encompasses both binary and ternary Group III-nitride compounds such as AlN, GaN, InN, AlGaN, AlInN, and GaInN.

The disclosure will now be described by a detailed description of several embodiments of the disclosure. It is clear that other embodiments of the disclosure can be configured according to the knowledge of persons skilled in the art without departing from the technical teaching of the disclosure, the disclosure being limited only by the terms of the appended claims.

Reference will be made to transistors. These can be devices having a first main electrode such as a drain, a second main electrode such as a source and a control electrode such as a gate for controlling the flow of electrical charges between the first and second main electrodes.

Figure 17:
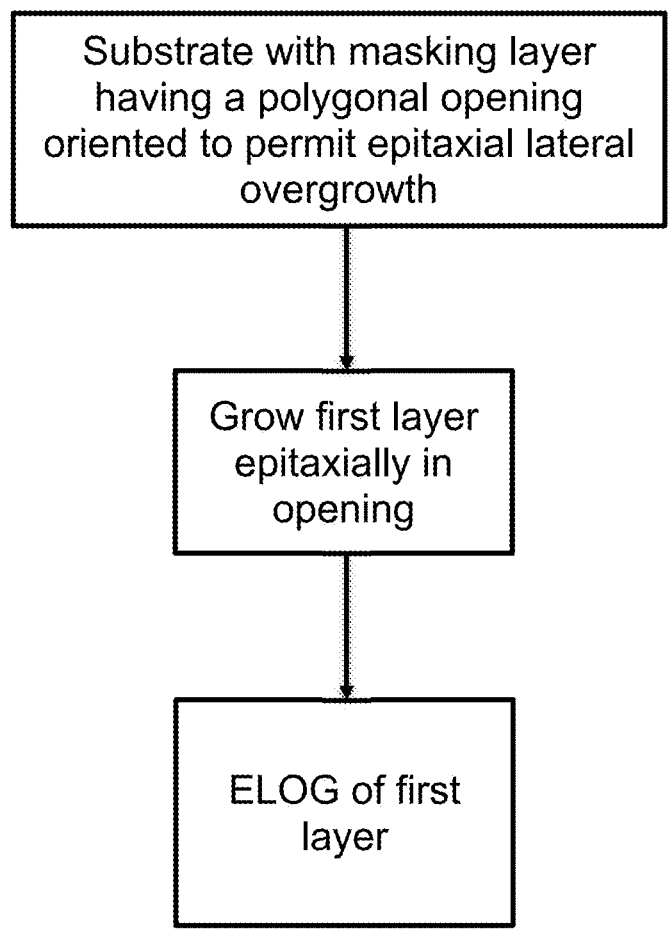
FIG. 17 shows a flowchart summarizing a representative method according to an embodiment of the first aspect of the present disclosure.

In a first aspect, the present disclosure relates to a method for forming a semiconductor structure. A representative method is summarized in FIG. 17.

The semiconductor structures obtainable by the present method have in common that they comprise an elongated structure. A typical example of application of the methods according to the first aspect is in the formation of fins for the formation of transistors or light emitting devices or detectors or sensors or MEMS structures. Examples of transistors that can be formed from the elongated structure obtained by the first aspect include Fin-type Field Effect Transistors (Fin-FETs), Tunnel Field Effect Transistors (TFETs), micro LED arrays, and micro photo detector arrays.

The method according to the first aspect comprises a step of providing a monocrystalline substrate. The method according to the first aspect can be applied to any monocrystalline substrate. The substrate can possess a crystal lattice with respect to which openings, formed in a masking layer above the substrate, can be oriented. An example of suitable crystal lattice is a cubic Bravais lattice, such as a face-centered cubic Bravais lattice. Examples of suitable monocrystalline substrates include Si and Ge.

The monocrystalline substrate can have an upper surface covered with a masking layer.

The upper surface may be typically parallel to a crystalline plane of the crystal lattice of the monocrystalline substrate. In some embodiments, such as in the case of a monocrystalline substrate possessing a cubic Bravais lattice, the upper surface may be parallel to a crystalline plane belonging to the family {111}, {110}, or {001}. In some embodiments, the upper surface may be parallel to a crystalline plane of Miller indices (111), (110), or (001). For example, in the case of a Si substrate, the upper surface may be parallel to a crystalline plane of Miller indices (111), (110), or (001).

In embodiments, the monocrystalline substrate may further comprise, on its upper surface, a nucleation layer comprising a second Group III-nitride compound. In some embodiments, the intrinsic lattice constant of the material forming the nucleation layer and of the material forming the first layer can be matching. In some embodiments, the material of the nucleation layer can be the same nature as the material forming the first layer. For instance, the nucleation layer can be a GaN layer or an AlN layer. The "nucleation" layer can also be referred to as the "second" layer. The presence of this nucleation layer on the upper surface of the monocrystalline substrate can facilitate the selective epitaxial growth process, thereby reducing the number of defects in the formed elongated structures obtained after ELOG.

The masking layer may be a material different from the material of the monocrystalline substrate. In some embodiments, the masking layer may be formed of a dielectric material. In some embodiments, the masking layer may be formed of an amorphous dielectric material. For instance, the masking layer may be formed of an oxide material such as $SiO_2$, a nitride material such as $Si_3N_4$, or a combination of both (e.g. $Si_3N_4$ on $SiO_2$).

The thickness of the masking layer may range, for instance, from 100 to 500 nm, from 200 to 400 nm, or from 250 to 350 nm.

The masking layer can have at least one opening exposing the upper surface of the monocrystalline substrate. The masking layer may have a single opening but will typically have a plurality of openings. These openings can, for instance, be formed by photolithography and dry etching. In some embodiments, the obtained combination of a monocrystalline substrate and a masking layer can then be cleaned and/or surface treated before starting the epitaxial growth. An example surface treatment could include a heating step at a temperature of at least 1000° C. in an $H_2$ ambient.

The openings can have a top surface defined by three or more straight edges forming a polygon parallel to the upper surface. The polygon may, for instance, be a triangle (in some embodiments, an equilateral triangle), a rectangle (e.g. a square), or a hexagon.

The polygon may be oriented in such a way with respect to the crystal lattice of the monocrystalline substrate so as to permit the epitaxial lateral overgrowth of the first layer in a direction perpendicular to at least one of the edges, thereby forming the elongated structure.

Not all orientations of the polygon permit the formation of an elongated structure by the epitaxial lateral overgrowth of the first layer in a direction perpendicular to at least one of the edges of said polygon. Suitable orientations can easily be determined by trial and error. In the case of a cubic lattice, suitable orientations of the polygon may be such that at least one of the three or more straight edges forming the polygon makes an angle of at most 100 with a crystalline plane of the crystal lattice, perpendicular to the upper surface, and belonging to a family of crystalline planes having Miller indices {1-10}. This can be illustrated in FIG. 1 for the case of a representative monocrystalline Si substrate having a top surface parallel to a crystalline plane belonging to the {111} family (here the crystalline plane (111)). On the left of FIG. 1, the polygon can oriented with two of its edges parallel to a crystalline plane of the crystal lattice, perpendicular to the upper surface, and belonging to a family of crystalline planes having Miller indices {1-10} (here the crystalline plane (1-10). As a result, ELOG occurs in a direction perpendicular to these edges. On the right of FIG. 1, none of the edges of the polygon make an angle of at most 100 with a crystalline plane of the crystal lattice, perpendicular to the upper surface, and belonging to a family of crystalline planes having Miller indices {1-10}. As a result, no ELOG can occur from any of these edges.

In embodiments of the present disclosure, at least one of the three or more straight edges (10) forming the polygon can be parallel to a crystalline plane of the crystal lattice, the crystalline plane being perpendicular to the upper surface, and belonging to a family of crystalline planes characterized by Miller indices {1-10}. In some embodiments, this can be the optimal orientation in the case of a substrate having a cubic lattice.

In embodiments, the at least one opening may comprise two or more collinear openings, wherein at least one of the edges of each opening may be oriented in a direction perpendicular to which the first layer can grow and may be parallel to, and facing, an edge of a neighboring opening oriented in a direction perpendicular to which the first layer can grow. This can permit the formation of an elongated structure bridging the two or more collinear openings.

In embodiments, said facing edges may have the same length. This can permit the formation of an elongated structure bridging the two or more collinear openings and having a single width.

In embodiments, the at least one opening may comprise a plurality of openings arranged in the form of a regular pattern, said plurality of openings comprising said two or more collinear openings.

Figure 2:
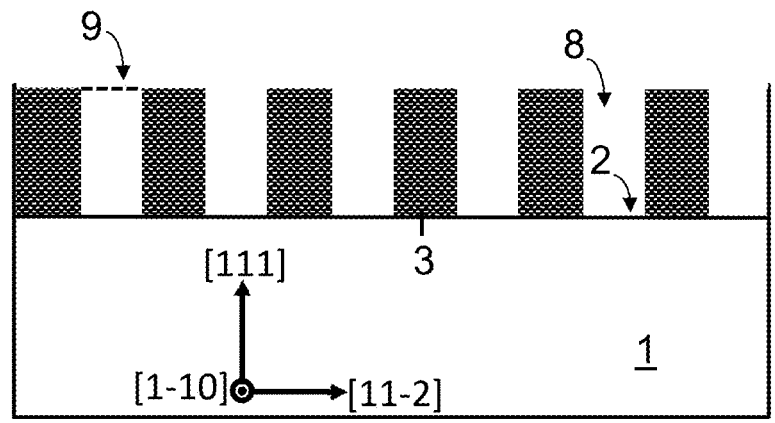
FIG. 2 shows three schematic representations, corresponding to two vertical cross-sections perpendicular to each other (Part (a) and Part (b)) and one top view Part (c), of a substrate for use in a method according to an embodiment of the present disclosure.
Figure 2:
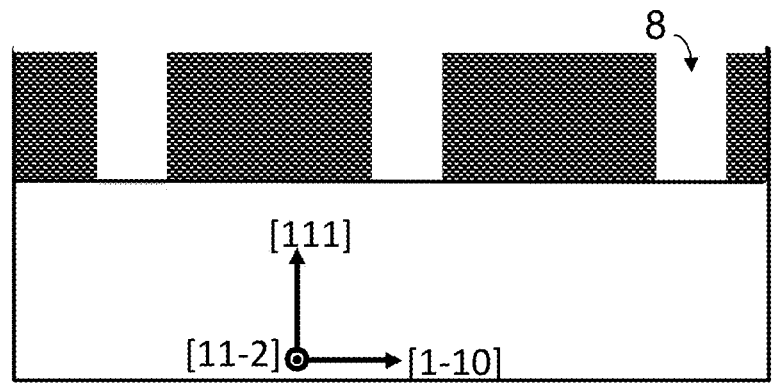
Figure 2:
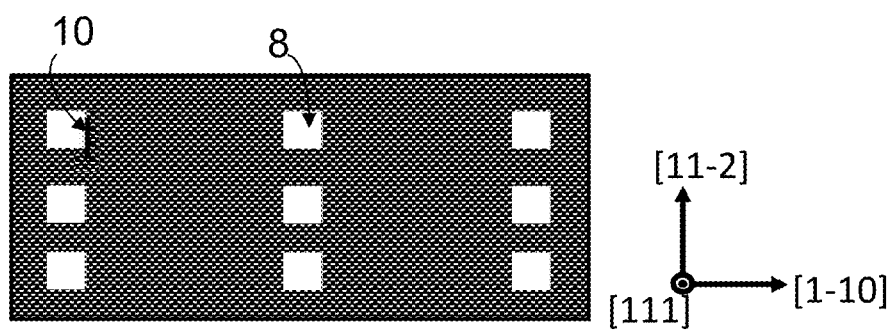

FIG. 2, Parts (a), (b) and (c), illustrate several of the representative embodiments above combined. FIG. 2, Part (a) shows a monocrystalline substrate (1), which can be a silicon substrate, having an upper surface (2) parallel to a crystalline plane of Miller indices belonging to the family {111}, covered with a masking layer (3), which can be a $SiO_2$ layer (3), comprising at least one opening (8) exposing the upper surface (2). FIG. 2, Part (b), is FIG. 2, Part (a), rotated horizontally by 90°. FIG. 2, Part (c) shows a top view of a portion of the structure. The at least one opening (8) has a top surface (9) defined by four straight edges (10) forming a square parallel to the upper surface (2). Two of these edges (10) may be parallel to a crystalline plane of the crystal lattice, perpendicular to the upper surface, and belonging to a family of crystalline planes characterized by Miller indices {1-10}. In the present case, these two edges (10) may be both parallel to crystalline planes (1-10) and (−110).

Figure 8:
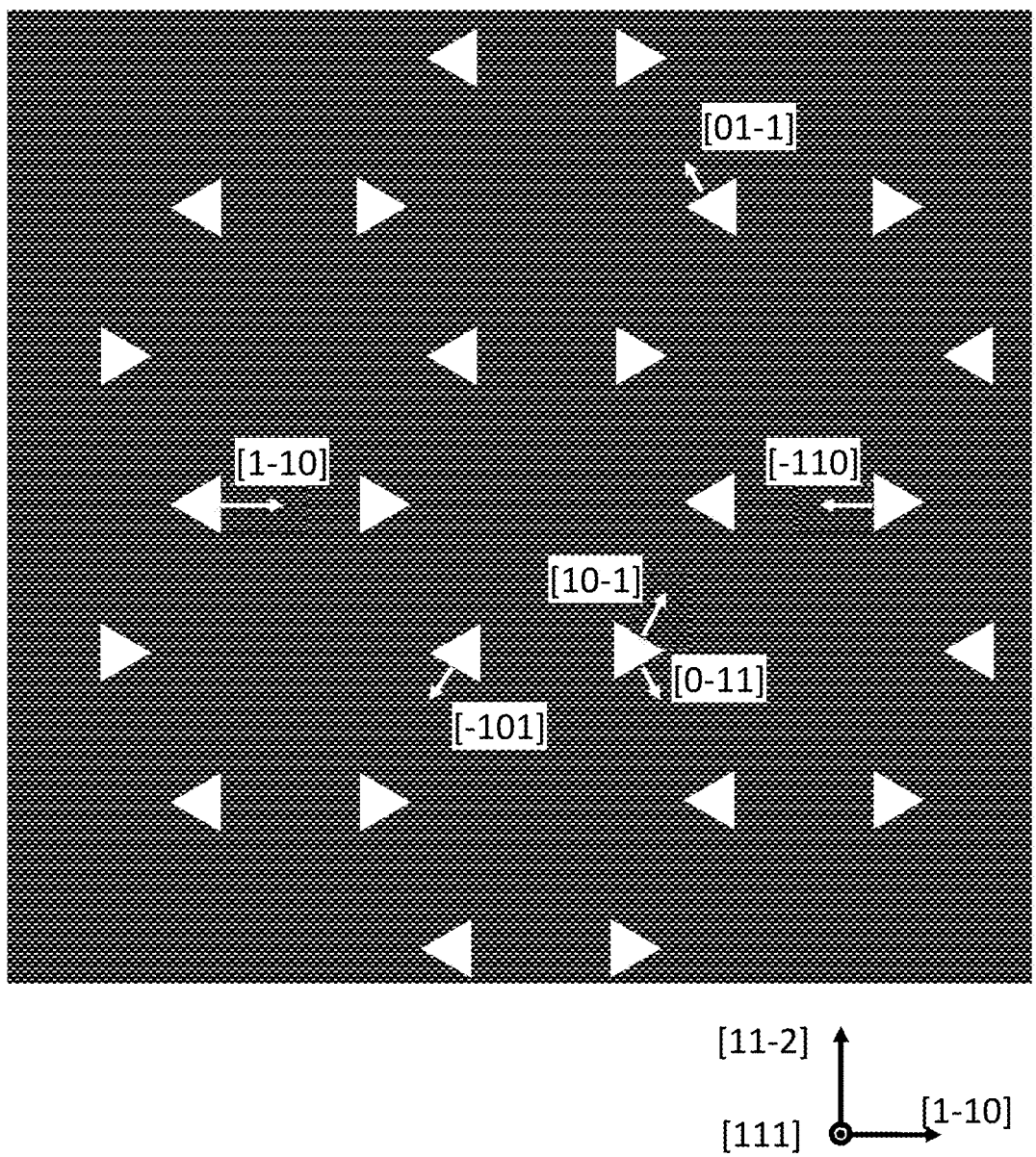
FIG. 8 shows a schematic representation corresponding to a top view of a substrate covered with a masking layer according to an embodiment of the present disclosure.

FIG. 8 shows an alternative representative embodiment wherein a monocrystalline substrate, which can be a silicon substrate, having an upper surface parallel to a crystalline plane of Miller indices belonging to the family {111} may be covered with a masking layer, the masking layer comprises triangular openings defined by three straight edges. Each of these edges may be parallel to a crystalline plane of the crystal lattice, perpendicular to the upper surface, and belonging to a family of crystalline planes characterized by Miller indices belonging to the family {1-10}. Six orientations may be present amongst these edges: [01-1], [−110], [0-11], [10-1], [−101], and [1-10]. The openings may be arranged in the form of a regular pattern comprising a plurality of collinear opening. Each opening may have a top surface defined by three edges and each edge may be oriented in a direction perpendicular to which the first layer can grow and may be parallel to, and facing (except the edges facing outward of the pattern and belonging to the openings forming the outer border of the pattern), an edge of a neighboring opening oriented in a direction perpendicular to which the first layer can grow.

Figure 11:
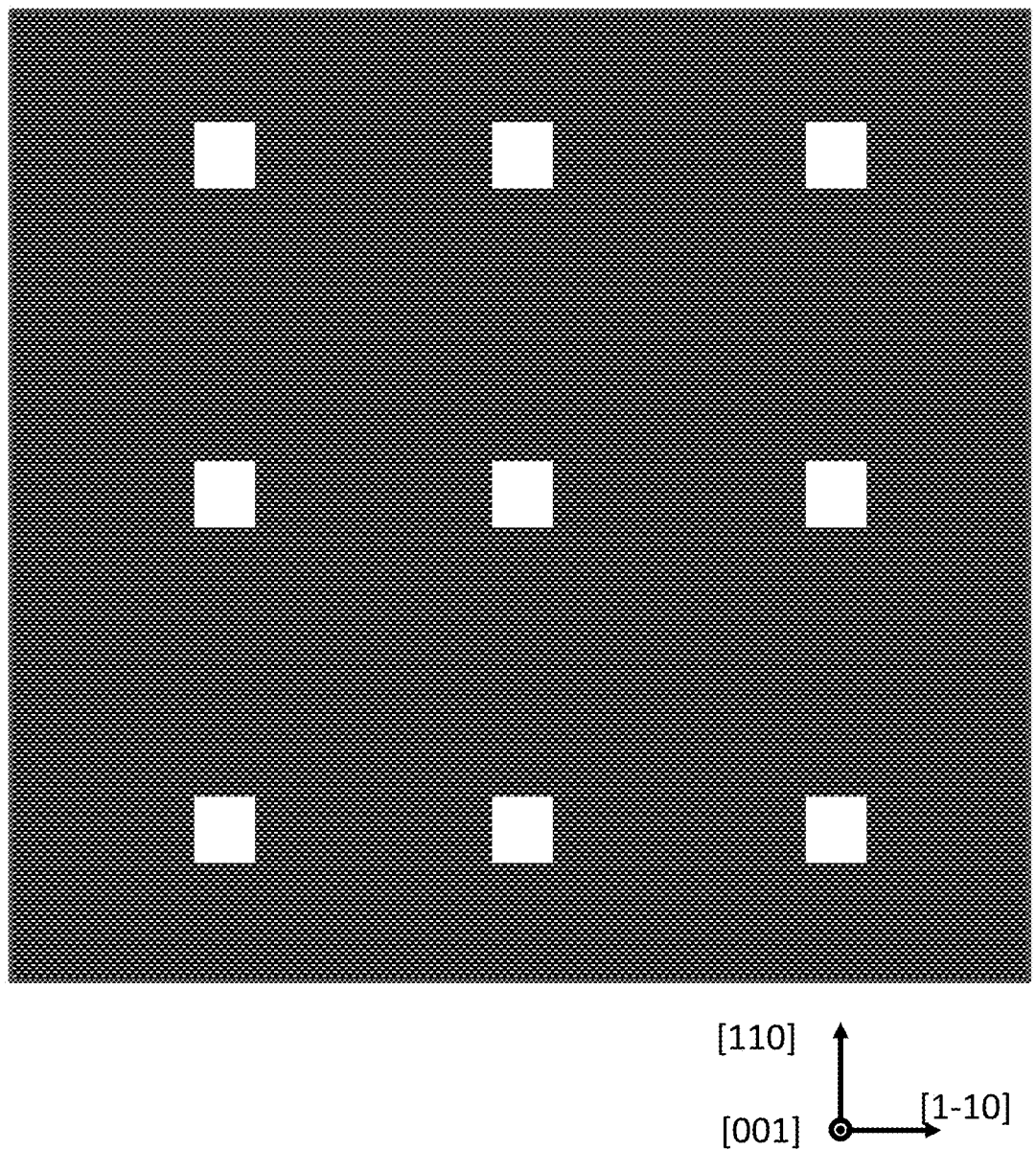
FIG. 11 shows a schematic representation, corresponding to a top view of a substrate presenting a top surface of Miller indices different from those of the top surface represented in FIG. 1, for use in a method according to an embodiment of the present disclosure.

FIG. 11 shows an alternative representative embodiment wherein a monocrystalline substrate, which can be a silicon substrate, having an upper surface parallel to a crystalline plane of Miller indices belonging to the family {001} may be covered with a masking layer, the masking layer comprises square openings defined by four straight edges. Each of these edges may be parallel to a crystalline plane of the crystal lattice, perpendicular to the upper surface, and belonging to a family of crystalline planes characterized by Miller indices belonging to the family {1-10}. The openings may be arranged in the form of a regular pattern comprising a plurality of collinear opening. Each opening has a top surface defined by four edges and each edge may be oriented in a direction perpendicular to which the first layer may be anticipated to grow and may be parallel to, and facing (except the edges facing outward of the pattern and belonging to the openings forming the outer border of the pattern), an edge of a neighboring opening oriented in a direction perpendicular to which the first layer may be anticipated to grow.

Figure 14:
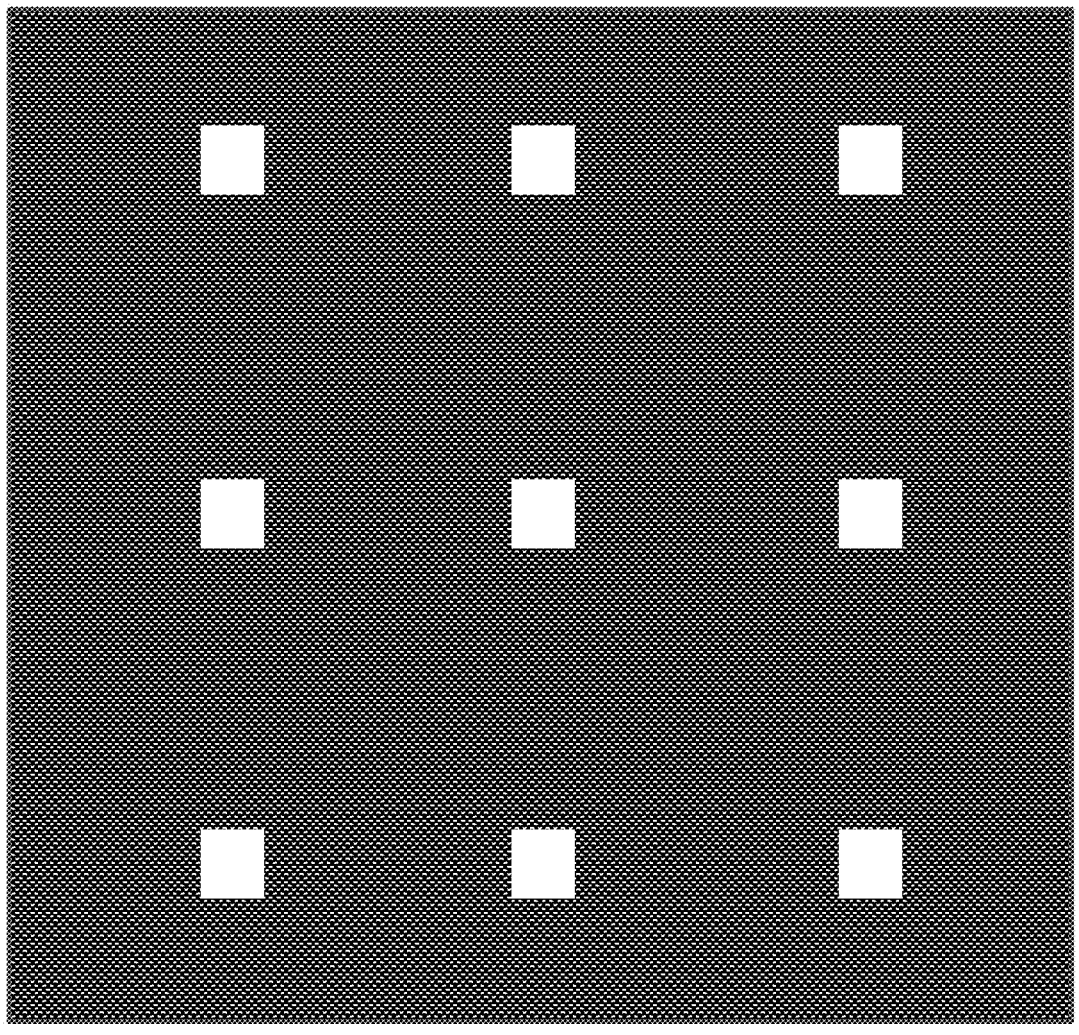
FIG. 14 shows a schematic representation, corresponding to a top view of a substrate presenting a top surface of Miller indices different from those of the top surface represented in FIGS. 2 and 11, for use in a method according to an embodiment of the present disclosure.

FIG. 14 shows an alternative representative embodiment wherein a monocrystalline substrate, which can be a silicon substrate, having an upper surface parallel to a crystalline plane of Miller indices belonging to the family {110} may be covered with a masking layer the masking layer comprises square openings defined by four straight edges. Each of these edges may be parallel to a crystalline plane of the crystal lattice, perpendicular to the upper surface, and belonging to a family of crystalline planes characterized by Miller indices belonging to the family {1-10}. The openings may be arranged in the form of a regular pattern comprising a plurality of collinear opening. Each opening has a top surface defined by four edges and each edge may be oriented in a direction perpendicular to which the first layer may be anticipated to grow and may be parallel to, and facing (except the edges facing outward of the pattern and belonging to the openings forming the outer border of the pattern), an edge of a neighboring opening oriented in a direction perpendicular to which the first layer may be anticipated to grow.

The method of the first aspect can further comprise a step of filing the opening by epitaxially growing therein a first layer comprising a first Group III-nitride compound. This step can, for instance, be performed by Metal-Organic Chemical Vapour Deposition (MOCVD). Typically, before starting the epitaxial growth, in some embodiments, the exposed substrate surface in the openings may be prepared by heating up the structure to at least 1000° C. in an $H_2$ ambient. The $H_2$ flow can typically depends on the reactor size and design. It can, for instance, range from 1 to 280 slm. The pressure in the reactor can also typically depends on the reactor size and design and may, for instance, range from 25 to 500 Torr. The duration of this treatment may be, for instance, at least 5 min and generally at least 10 min. This treatment can be performed while the structure under construction is rotating, for instance, at a speed ranging from 500 to 2000 rpm.

If no nucleation layer was present on the monocrystalline substrate, the step of filling the openings may begin by growing a nucleation layer of the first Group III-nitride compound in the bottom of the openings. This growth can be performed for instance at a temperature below 900° C., generally below 800° C., usually below 600° C. The pressure of the reactor may range from 300 to 700 Torr. This growth may be performed in an atmosphere comprising $H_2$ (e.g. from ranging from 90 to 150 slm), $N_2$ (e.g. ranging from 30 to 90 slm) and $NH_3$ (e.g. ranging from 25 to 75 slm), and a precursor of the Group III element (e.g. ranging from 2 to 10 sccm) so as to favor the formation of a nitride of the Group III element. Also, a nucleation layer may be formed by rotating the substrate during the formation of the nucleation layer. This rotation can, for instance, be performed at a speed ranging from 500 to 2000 rpm. This nucleation layer typically only forms on the monocrystalline substrate at the bottom of the holes and not on the masking layer. Once, a nucleation layer covers the bottom of the openings, the step of filling the opening can be continued at a higher temperature. For instance, a temperature at or above 900° C. can be used. In embodiments, a lower pressure, such as a pressure ranging from 150 to 250 Torr, can be used. The flow of Group III precursor, $NH_3$, $N_2$, and $H_2$ can, for instance, remain the same as for the formation of the nucleation layer.

In embodiments, the first Group III-nitride compound may be GaN.

Figure 3:
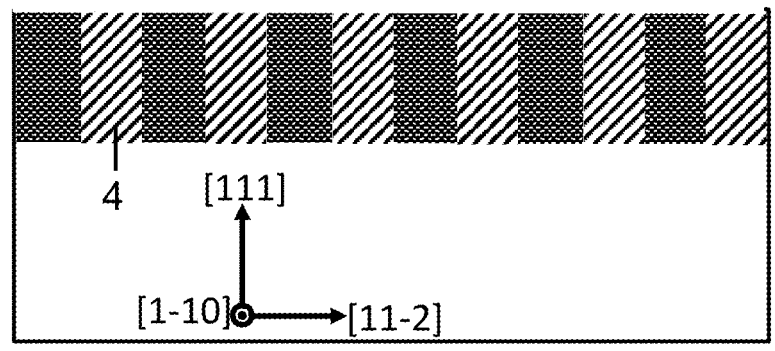
FIG. 3 shows the three schematic representations (Parts (a), (b) and (c)) of FIG. 2 wherein the openings have been filled according to an embodiment of the present disclosure.
Figure 3:
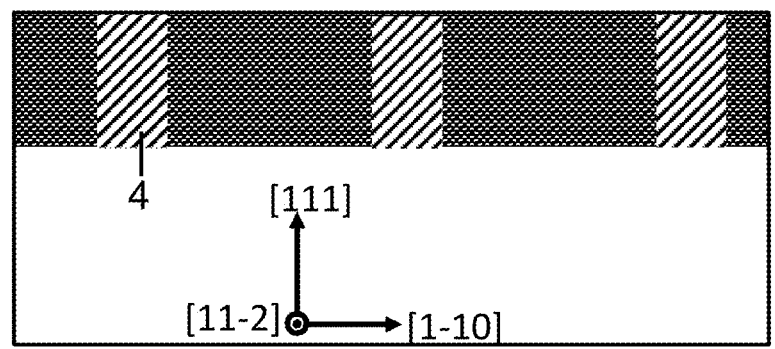
Figure 3:
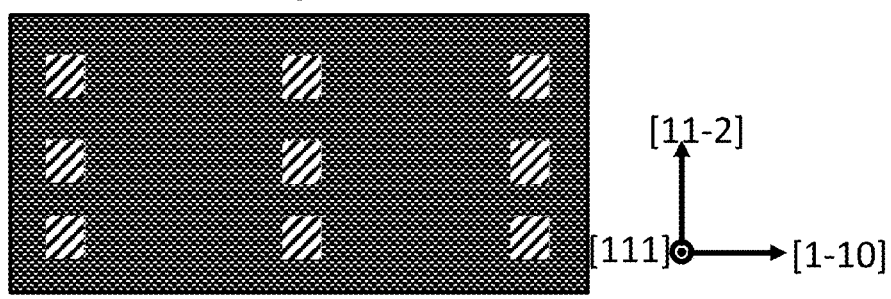

FIG. 3, Parts (a), (b) and (c), show the representative structure of FIG. 2, Parts (a), (b) and (c) after filling of the openings (8) by epitaxially growing therein a first layer (4) comprising a first Group III-nitride compound, which can be GaN.

Figure 9:
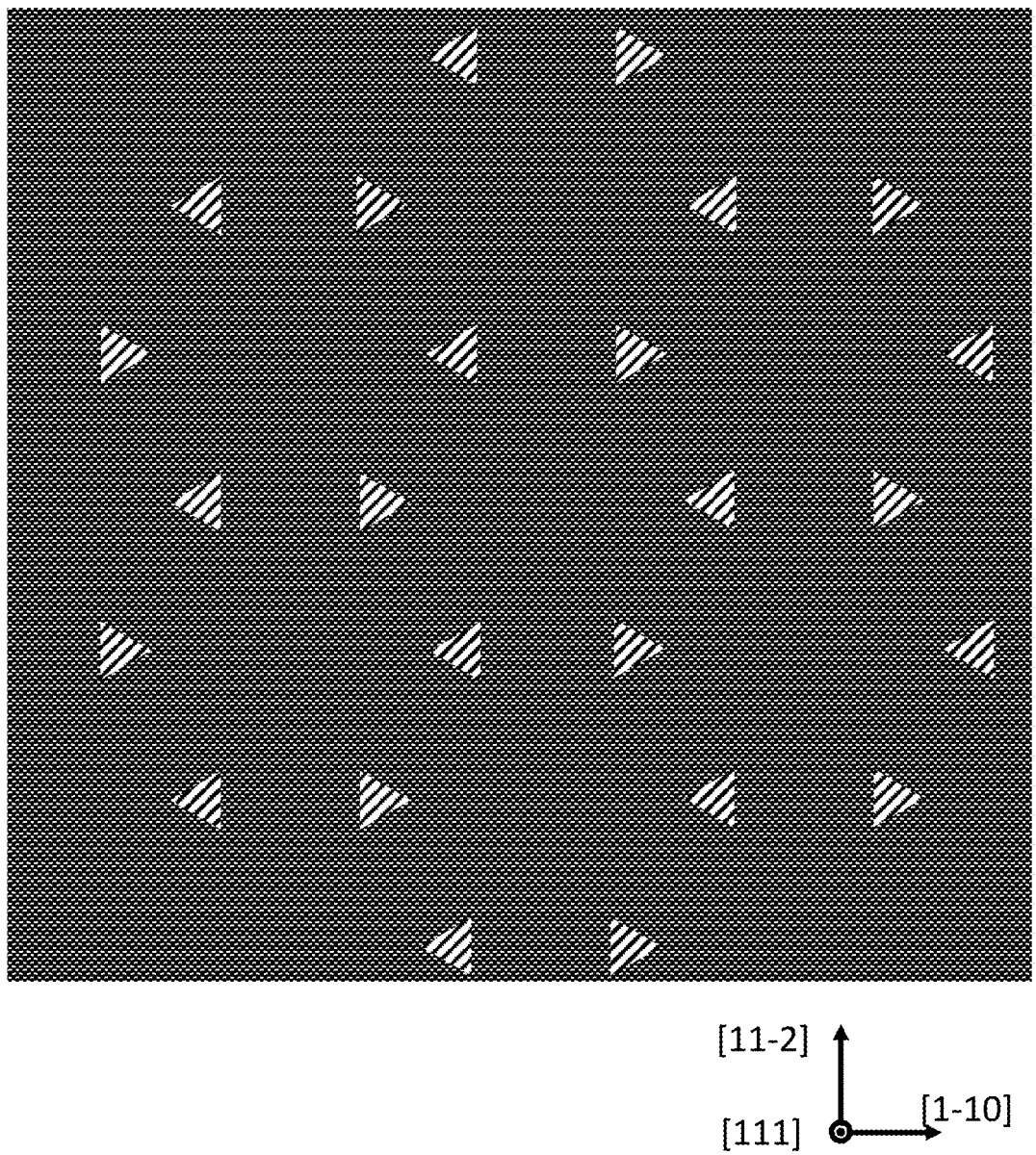
FIG. 9 shows the schematic representations of FIG. 8 wherein the openings have been filled with a first layer according to an embodiment of the present disclosure.

FIG. 9 shows the representative structure of FIG. 8 after filling of the openings by epitaxially growing therein a first layer comprising a first Group III-nitride compound, which can be GaN.

Figure 12:
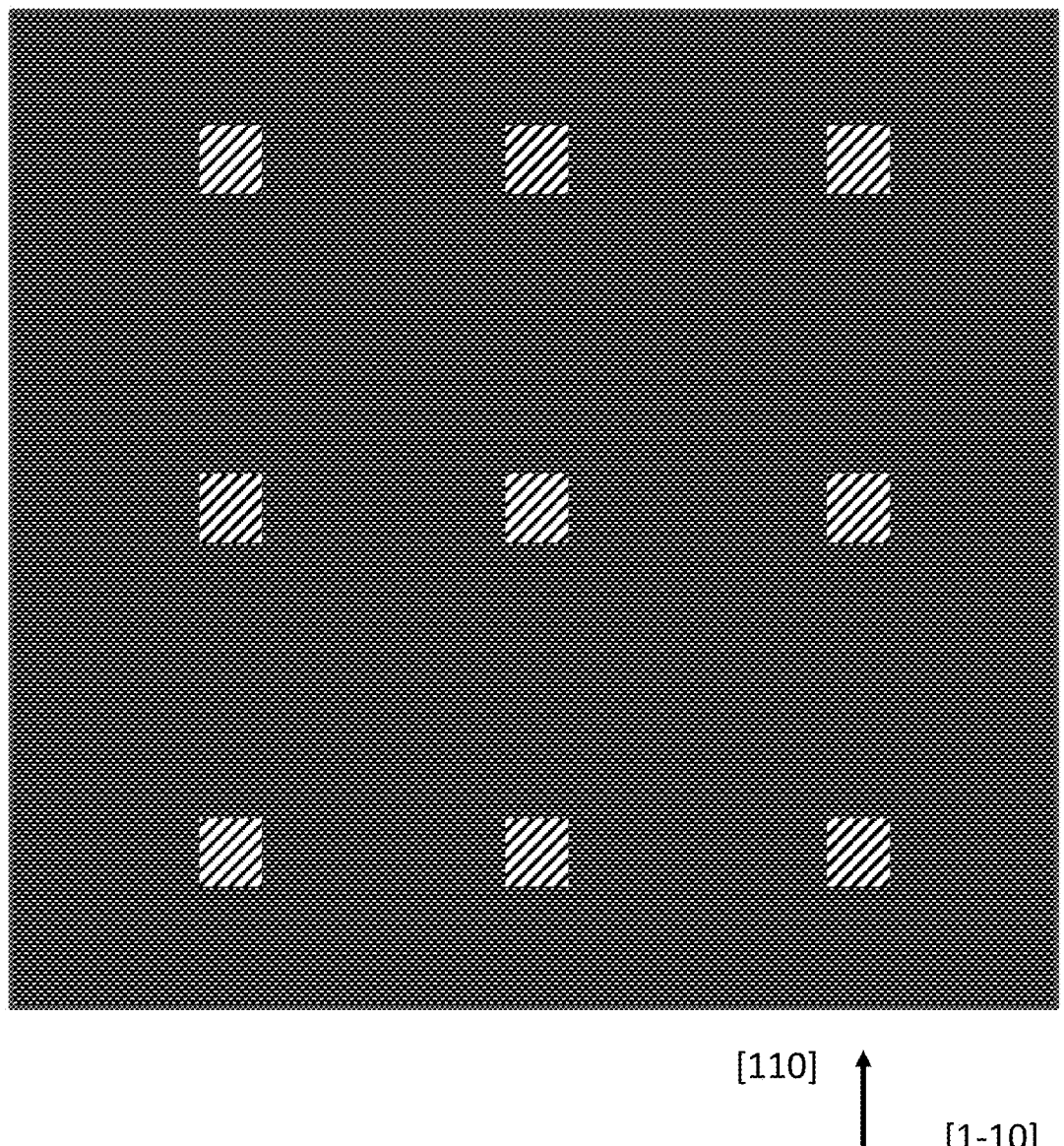
FIG. 12 shows the schematic representations of FIG. 11 wherein the openings have been filled with a first layer according to an embodiment of the present disclosure.

FIG. 12 shows the representative structure of FIG. 11 after filling of the openings by epitaxially growing therein a first layer comprising a first Group III-nitride compound, which can be GaN.

Figure 15:
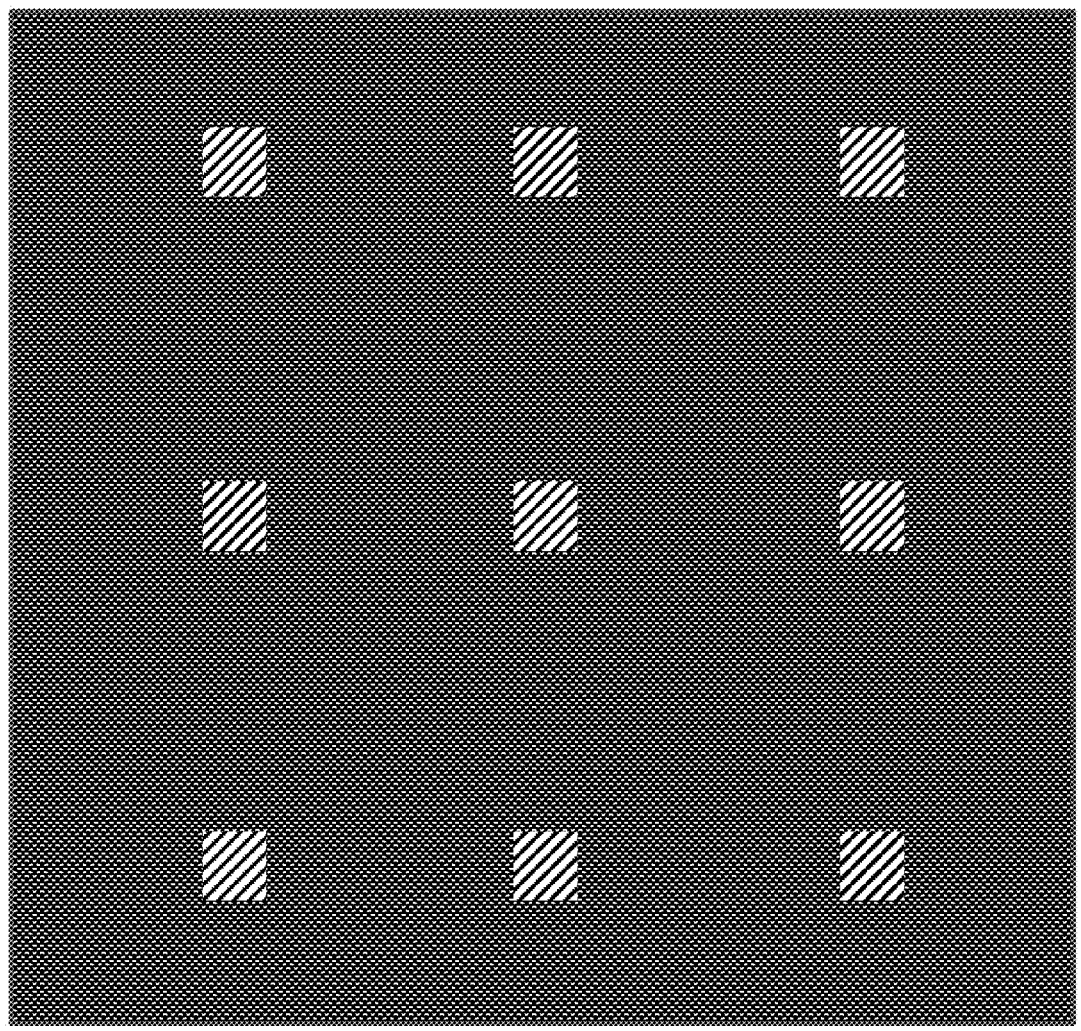
FIG. 15 shows the schematic representations of FIG. 14 wherein the openings have been filled with a first layer according to an embodiment of the present disclosure.

FIG. 15 shows the representative structure of FIG. 14 after filling of the openings by epitaxially growing therein a first layer comprising a first Group III-nitride compound, which can be GaN.

The method of the first aspect can further comprise growing the first layer further above the opening and on the masking layer by ELOG. To favor ELOG, the reactor pressure can be decreased. For instance, it can be set between 50 and 100 Torr. Also, the temperature may be raised above the temperature used to fill the openings. For instance, a temperature above 1010° C. can be used. Also, in some embodiments, $H_2$ may be excluded in this step. The $N_2$ flow can be increased for this step. In some embodiments, the $N_2$ flow can range from 120 to 240 slm. The flow of Group III precursor can be increased for this step. In some embodiments, the flow of Group III precursor can be increased at least twenty times. For instance, it can be brought to a flow ranging from 40 to 200 sccm. The flow of $NH_3$ can be reduced for this step. In some embodiments, the $NH_3$ flow can be reduced 5 to 15 times. In some embodiments, the $NH_3$ flow can be set from 2 to 8 slm.

In embodiments, the $NH_3$ flow can be cyclically interrupted during the ELOG process. This can be favorable to ELOG.

Optionally, once the desired length is achieved for the elongated structure, the morphology of the surface can be improved by growing from 250 nm to 750 nm of undoped Group III-nitride on the elongated structure by introducing $H_2$ (e.g. ranging from 60 to 180 slm), decreasing the flow of $N_2$ (for instance, this decrease can be by a factor of from 2 to 4; for instance, the flow can be set from 40 to 80 slm), increasing the flow of $NH_3$ (for instance, this increase can be by a factor of from 5 to 15; for instance, the flow can be set from 25 to 75 slm) and keeping the flow of Group III precursor unchanged or within the same range as during ELOG.

Figure 4:
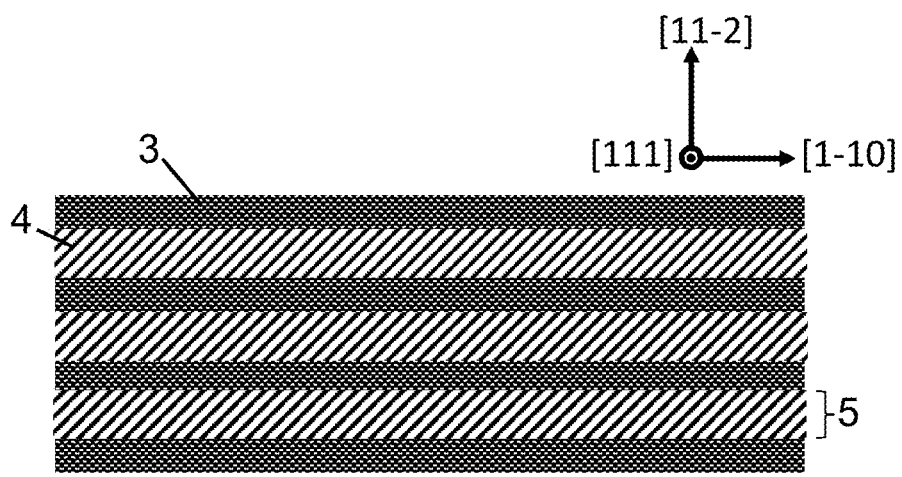
FIG. 4 shows the schematic representation of FIG. 3 corresponding to a top view wherein the first layer has been grown further above the opening and on the masking layer by epitaxial lateral overgrowth according to an embodiment of the present disclosure.

FIG. 4 shows the representative structure of FIG. 3 after growing the first layer (4) further above the opening (8) and on the masking layer (3) by epitaxial lateral overgrowth, thereby forming elongated structures (5).

Figure 10:
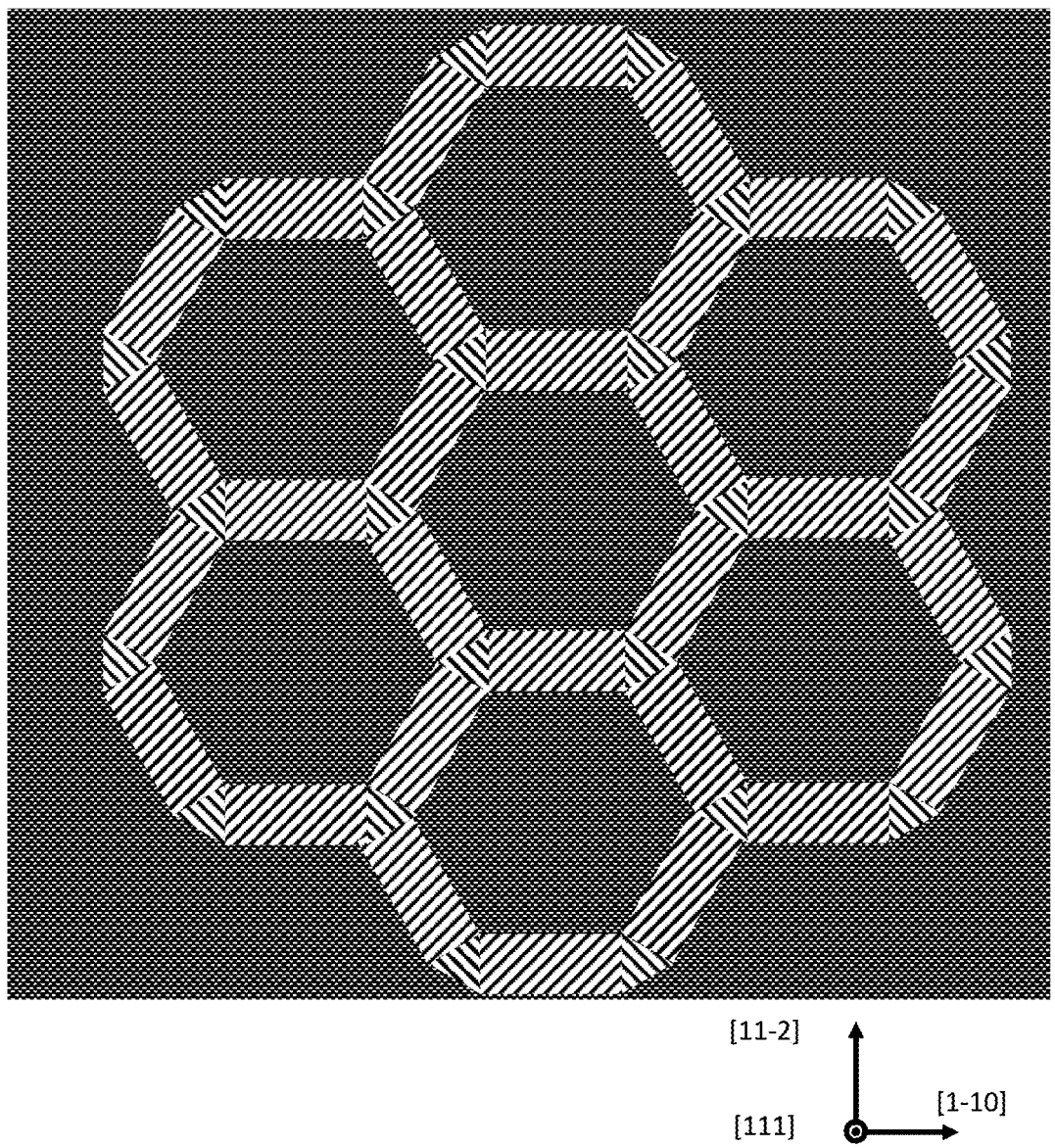
FIG. 10 shows the schematic representation of FIG. 9 wherein the first layer has been grown further above the opening and on the masking layer by epitaxial lateral overgrowth according to an embodiment of the present disclosure.

FIG. 10 shows the representative structure of FIG. 9 after growing the first layer further above the opening and on the masking layer by epitaxial lateral overgrowth, thereby forming elongated structures.

Figure 13:
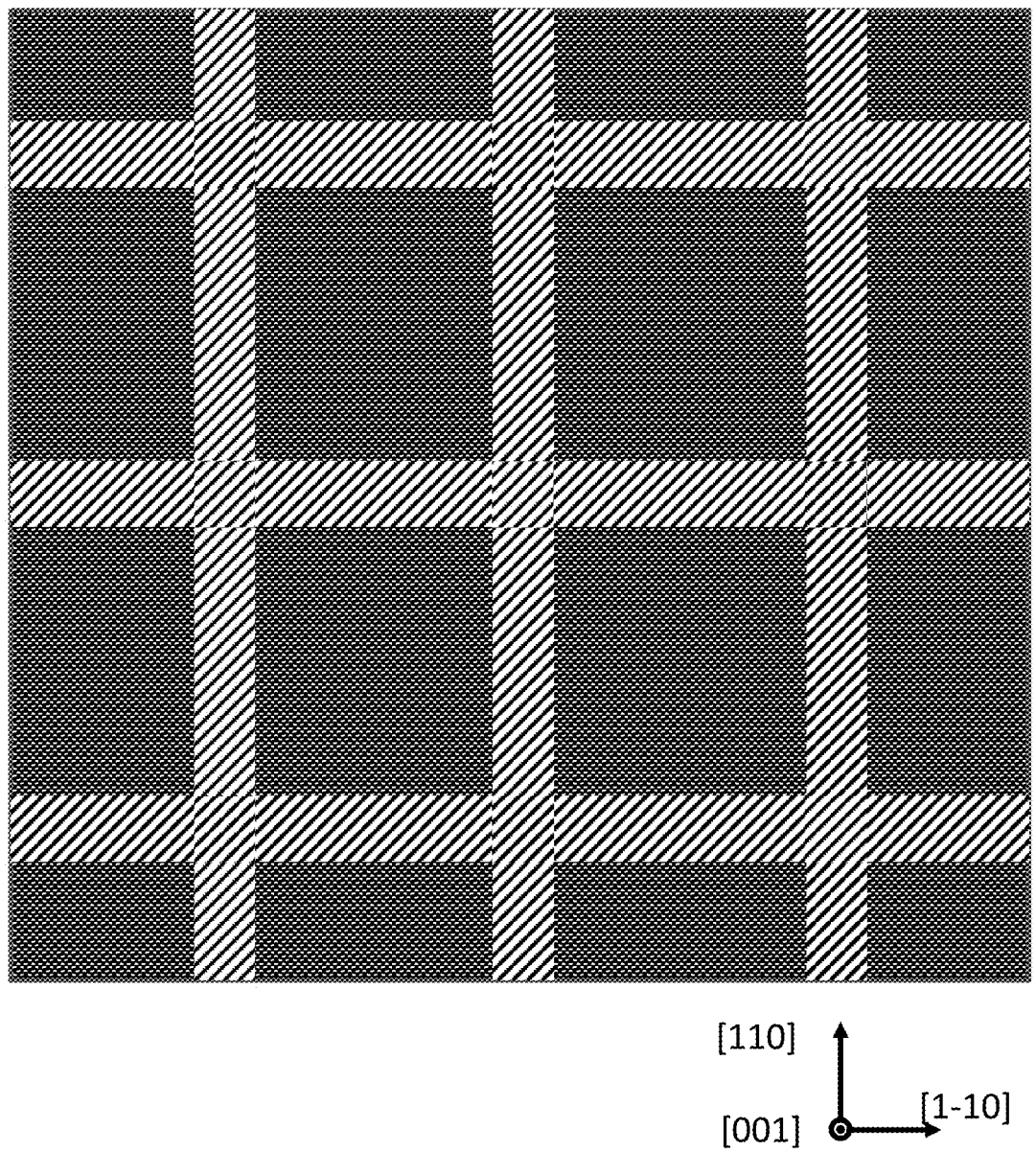
FIG. 13 shows the schematic representation of FIG. 12 wherein the first layer has been grown further above the opening and on the masking layer by epitaxial lateral overgrowth according to an embodiment of the present disclosure.

FIG. 13 shows the representative structure of FIG. 12 after growing the first layer further above the opening and on the masking layer by epitaxial lateral overgrowth, thereby forming elongated structures.

Figure 16:
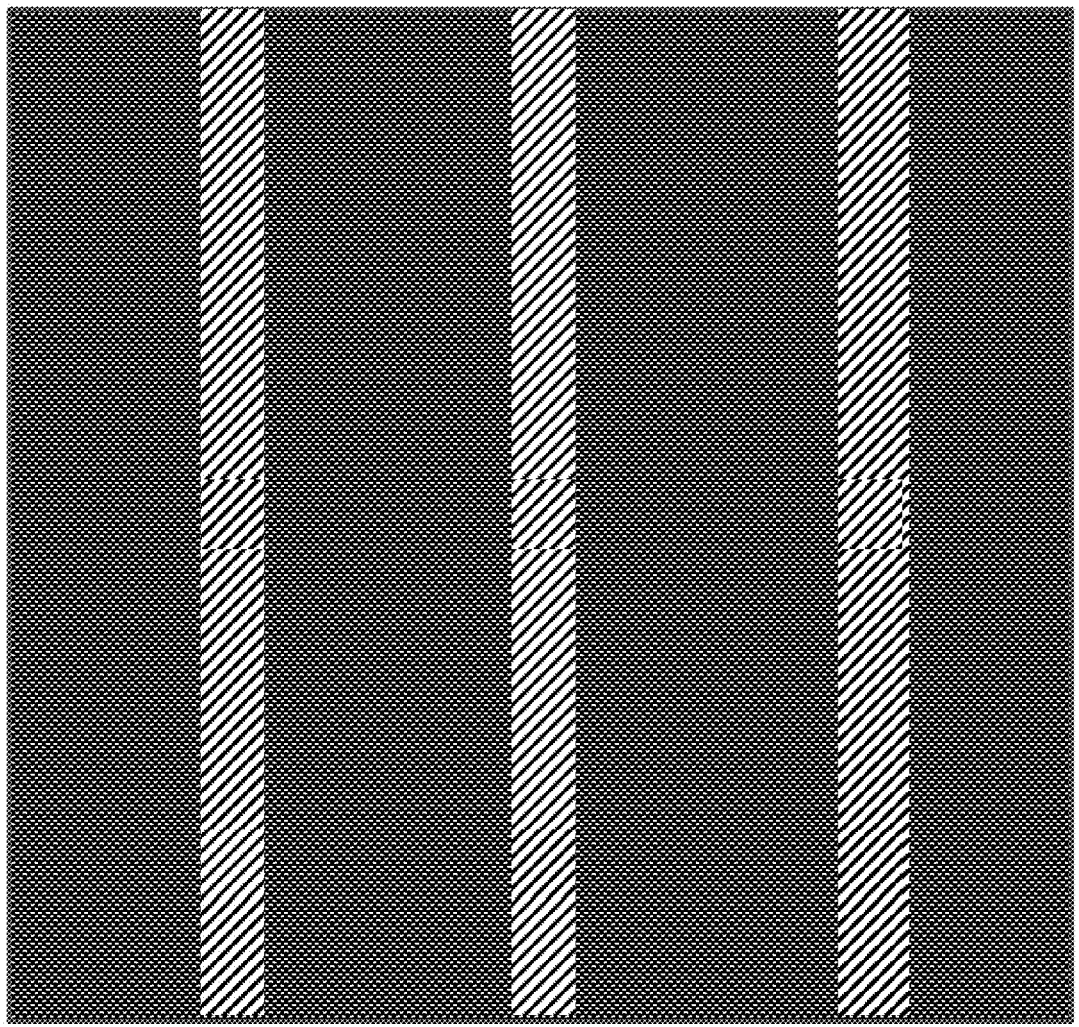
FIG. 16 shows the schematic representation of FIG. 15 wherein the first layer has been grown further above the opening and on the masking layer by epitaxial lateral overgrowth according to an embodiment of the present disclosure.

FIG. 16 shows the representative structure of FIG. 15 after growing the first layer further above the opening and on the masking layer by epitaxial lateral overgrowth, thereby forming elongated structures.

In embodiments, the first aspect may relate to the manufacturing of a fin-type field effect transistor (FinFET) comprising:

forming an elongated structure according to the method of any of the embodiments described for the first aspect, providing, conformally on the elongated structure, a third layer comprising a third Group III-nitride compound (for instance, an AlN, an AlGaN, an InAlN, an InN, or an InGaN layer). The third Group III-nitride compound may be a binary or a ternary Group III-nitride compound.

In embodiments, the third Group III-nitride compound may have a higher bandgap than the first III-nitride compound. For this purpose, the third Group III-nitride compound may comprise Al. This third layer may serve as a barrier layer. The presence of the third layer having a higher bandgap than the first III-nitride compound can permit the formation of a two-dimensional electron gap in an upper part of the first layer, thereby permitting the formation of a high electron mobility transistor (HEMT) FinFET. InAlN as a third layer may be useful for HEMT operating at radiofrequency.

This embodiment leads to an intermediate in the fabrication of a FinFET.

Figure 5:
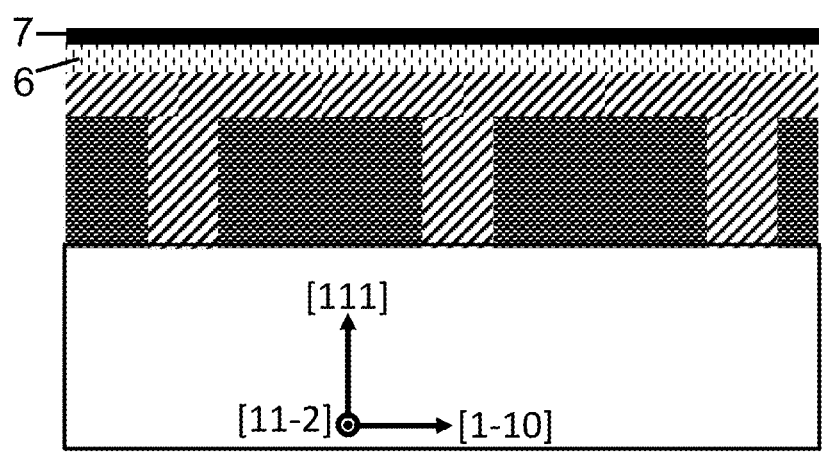
FIG. 5 shows the schematic representation of FIG. 3, Part (b), wherein further layers have been provided for manufacturing a fin-type field effect transistor according to an embodiment of the present disclosure.
Figure 6:
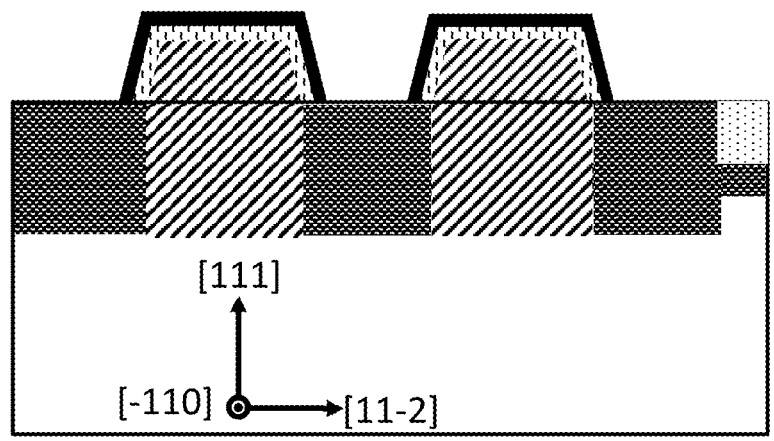
FIG. 6 shows the schematic representation of FIG. 5 rotated horizontally by 90°.

In embodiments, the method for manufacturing a FinFET may further comprise forming, in-situ with the third layer (6), a fourth layer (7) (on the third layer (6)) comprising a dielectric material (for instance $Si_3N_4$). This fourth layer may serve as a cap layer. This is illustrated for a representative embodiment in FIGS. 5 and 6. FIG. 6 is a cross-section of the device of FIG. 5 rotated by 90°.

For instance, the substrate may be a Si wafer presenting a (111) top surface on which a $SiO_2$ masking layer may be present, the masking layer having square openings. Two of the edges of each square opening may be oriented parallel to a crystalline plane of the crystal lattice, perpendicular to the upper surface, and belonging to a family of crystalline planes characterized by Miller indices {1-10}. GaN may be epitaxially grown in the openings and above the openings by ELOG in a direction perpendicular to two of the edges of each square. A 3 nm AlN barrier may be deposited conformally on the GaN layer and, in situ with the AlN barrier, a $Si_3N_4$ cap may be deposited on the AlN barrier layer, thereby forming an intermediate in the fabrication of a HEMT FinFET.

In embodiments, the method for manufacturing a FinFET may further comprise providing a source, a drain and a gate to the structure under construction. In embodiments, source and drain can be formed by providing a conductive material making ohmic contacts on the first layer (where the two-dimensional electron gas may be present).

For HEMT obtained according to embodiments of the present disclosure, a low channel resistance in the ON state can be obtained due to the two-dimensional electron gap formed. In some embodiments, a high breakdown voltage can be observed due to the high bandgap of Group III-nitride compounds such as GaN when compared to, for instance, GaAs. In some embodiments, a high power density can be obtained. For instance, a power density of from 5 to 12 W/mm can be achieved for GaN to be compared to a power density of about 1.5 W/mm typical for GaAs. Thus, the use of a group III-Nitride can provide high efficiency at high voltage and high power, in addition to high chemical and thermal stability.

In embodiments, the first aspect may relate to the manufacturing of a tunnel field effect transistor (TFET) comprising:

forming an elongated structure according to the method of any of the embodiments described for the first aspect; and providing, conformally on the elongated structure, a stack of layers, each comprising at least a Group III-nitride compound, wherein a bottom layer of the stack comprises an n-type III-nitride compound and a top layer of the stack comprises a p-type III-nitride compound.

Figure 7:
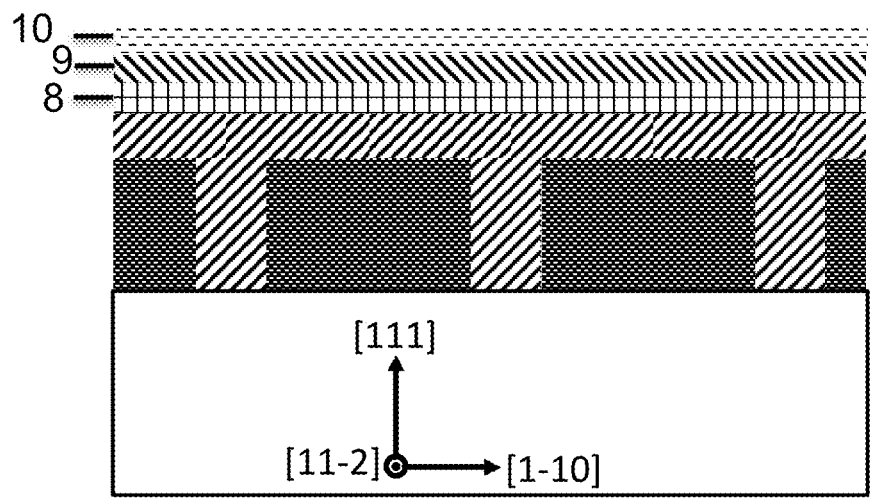
FIG. 7 shows the schematic representation of FIG. 3, Part (b), wherein further layers have been provided for manufacturing a semiconductor device according to an embodiment of the present disclosure.

For instance, the stack of layers may consist of an InN or InGaN layer sandwiched between a p-doped GaN bottom layer and an n-doped GaN top layer. This may be illustrated in FIG. 7 wherein a semiconductor structure can be depicted which comprises a Si wafer presenting a (111) top surface on which a $SiO_2$ masking layer may be present, the masking layer having square openings. Two of the edges of each square opening may be oriented parallel to a crystalline plane of the crystal lattice, perpendicular to the upper surface, and belonging to a family of crystalline planes characterized by Miller indices {1-10}. GaN may be epitaxially grown in the openings and above the openings by ELOG in a direction perpendicular to two of the edges of each square. A p-doped GaN layer (8) may be deposited conformally on the GaN layer, an InN layer (9) may be deposited conformally on the p-doped GaN layer, and a n-doped GaN layer (10) may be deposited conformally on the InN layer (9), thereby forming an intermediate in the fabrication of a TFET.

In embodiments, the method for manufacturing a TFET may further comprise providing a source, a drain and a gate to the structure under construction.

In embodiments, the first aspect may relate to the manufacturing of a light emitting device (LED) comprising:

forming an elongated structure according to the method of any of the embodiments described for the first aspect; and providing, conformally on the elongated structure, a stack of layers, each comprising at least a Group III-nitride compound, wherein a bottom layer of the stack comprises an n-type III-nitride compound and a top layer of the stack comprises a p-type III-nitride compound.

In particular, the stack of layers may comprise a stack of two alternating layers, each of the two alternating layers being made of a different Group III-nitride compound, wherein the bottom layer of the stack may be n-doped and the top layer of the stack may be p-doped.

In one embodiment, the stack of layers comprises a stack of alternating InGaN and GaN layers, wherein the bottom layer may be an n-doped GaN layer and the top layer may be a p-doped GaN layer.

In embodiments, the first aspect may relate to the manufacturing of a sensor, such as a biosensor, comprising:

forming an elongated structure according to the method of any of the embodiments described for the first aspect, and selectively removing the masking layer.

Selectively removing the masking layer can, for instance, be performed by wet etching. This permits the formation of a suspended elongated structure.

The elongated structure obtained by the first aspect of the present disclosure can find applications in solid state lighting (LED, laser), power amplifier (e.g. for CATV), power conversion (e.g. for EV/HEV automotive, for data centers), in satellite communication, 5G applications, biosensors, logic applications (TFET), amongst others.

In a second aspect, the present disclosure relates to a semiconductor structure. This semiconductor structure may be obtainable by embodiments of the first aspect. Features of the second aspect may be as described for corresponding features of the first aspect.

In an embodiment, the semiconductor structure may be a transistor (e.g. a HEMT or a TFET), a detector (e.g. a photodetector or micro photo detector arrays), a sensor (e.g. a light sensor), a microelectromechanical system, or a light emitting device (e.g. micro LED arrays).

Example: Representative Procedure to Achieve GaN Fins by a Combination of Selective Epitaxial Growth (SEG) and Epitaxial Lateral Overgrowth (ELOG)

The process can start with the preparation of the patterned template wafer. 300 nm of a dielectric material, which could be $SiO_2$, $Si_3N_4$, or combination of $SiO_2$ and $Si_3N_4$, or others, may be deposited on the Si wafer with Si {111} top surface. Square holes may be opened at particular places and with particular orientations as shown in FIG. 2, Part (c), by photolithography and dry etching to expose the substrate surface underneath for the growth to start on. A standard clean and surface treatment follows before starting the epitaxial growth in an MOCVD system.

The MOCVD system used in this procedure may be a Veeco Maxbright MOCVD system, capable to grow on three 200 mm wafers in a single run. First, a nucleation layer may be grown in the holes, on the substrate. Substrates may be loaded into the MOCVD reactor on a carrier; the carrier rotation speed may be ramped to 1000 rpm; the reactor pressure may be ramped to 75 torr; the temperature may be ramped to 1050° C. in an $H_2$ ambient with a 190 slm flow for in-situ surface treatment for 10 minutes; the temperature may then be decreased to 550° C., in an ambient with $H_2$ flow of 120 slm, $N_2$ flow of 64 slm and $NH_3$ flow of 50 slm. The reactor pressure may then be ramped up to 500 Torr. A low temperature (LT) GaN nucleation layer may be grown with a trimethyl gallium (TMGa) precursor flow of 5 sccm and an $NH_3$ flow 50 slm. The deposition time may be determined by the size of the holes, and the ratio of open area/masked area. The LT-GaN deposition may be selectively deposited only inside the opened holes with Si (111) surface and not deposited on the dielectric layers. The growth temperature may be as low as possible to minimize the Ga etch back on the Si surface. 550° C. may be the lowest temperature that the Veeco Maxbright MOCVD system can control and therefore, the temperature used. A very low TMGa flow may be used in the process to decrease the growth rate inside the holes as a counter solution of the loading effect during the selective growth inside the holes.

The openings may then be filled epitaxially with the first layer (GaN) as follows: The temperature may be ramped up to 1010° C. in the same ambient gas to continue GaN SEG inside the holes. The reactor pressure may be ramped to 200 Torr. The TMGa flow may be 5 sccm and the $NH_3$ flow may be 50 slm. 300 nm GaN layers may be deposited and fill up the openings. The deposition time can be decided by the size of the openings, and the ratio of open area/mask area.

The first layer (GaN) may then be grown further above the opening and on the masking layer by ELOG to form elongated structures as follow. After the openings are filled, the reactor pressure may be ramped up to 75 Torr, and the temperature may be ramped to 1040° C. to enhance the ELOG with better surface morphology and vertical sidewalls in {1-10} orientations parallel to the substrate top surface. The ambient gas may be $N_2$ with a flow of 180 slm without $H_2$ to further enhance the lateral overgrowth. The TMGa flow may be 125 sccm with an $NH_3$ flow of 5 slm. In one embodiment, ELOG may be further enhanced by using modulated $NH_3$ flow by controlling the interruption of $NH_3$ flow during the growth. The growth time of the GaN ELOG may be decided by the length of the elongated structure one wishes to achieve.

Once the designed length for the fin structures is achieved, the ambient gas is then ramped to 120 slm $H_2$, 64 slm $N_2$ and 50 slm $NH_3$ and 500 nm undoped GaN may then be grown on the fin structures with a TMGa flow 125 sccm to improve the surface morphology. The resulting structure can then be used to form a semiconductor device.

It is to be understood that although some embodiments, specific constructions, and configurations, as well as materials, have been discussed herein for devices according to the present disclosure, various changes or modifications in form and detail may be made without departing from the scope and spirit of this disclosure. Functionality may be added or deleted from the block diagrams and operations may be interchanged among functional blocks. Steps may be added or deleted to methods described within the scope of the present disclosure.

The invention claimed is:

1. A method for forming a semiconductor structure comprising an elongated structure, the method comprising:
   providing a monocrystalline substrate having an upper surface covered with a masking layer, the masking layer comprising at least one opening exposing the upper surface;
   filling the opening by epitaxially growing therein a first layer comprising a first Group III-nitride compound; and
   growing the first layer further above the opening and on the masking layer by epitaxial lateral overgrowth to form an elongated structure,
   wherein the at least one opening has a top surface defined by three or more straight edges forming a polygon parallel to the upper surface and oriented in such a way with respect to a crystal lattice of the monocrystalline substrate so as to permit the epitaxial lateral overgrowth of the first layer in a direction perpendicular to at least one of the three or more straight edges, thereby forming the elongated structure; and
   wherein the at least one of the three or more straight edges forming the polygon makes an angle of at most 10° with a crystalline plane of the crystal lattice, perpendicular to the upper surface, and belonging to a family of crystalline planes having Miller indices {1-10}.

2. The method according to claim 1, wherein the at least one of the three or more straight edges forming the polygon is parallel to a crystalline plane of the crystal lattice, perpendicular to the upper surface, and belonging to a family of crystalline planes characterized by Miller indices {1-10}.

3. The method according to claim 1, wherein the at least one opening comprises two or more collinear openings, wherein the at least one of the three or more edges of each opening is oriented in a direction perpendicular to which the first layer can grow and is parallel to, and facing an edge of a neighboring opening oriented in a direction perpendicular to which the first layer grows.

4. The method according to claim 3, wherein said facing edges have a same length.

5. The method according to claim 1, wherein the at least one opening comprises a plurality of openings arranged in the form of a regular pattern, said plurality of openings comprising said two or more collinear openings.

6. The method according to claim 1, wherein the monocrystalline substrate is a silicon substrate.

7. The method according to claim 1, wherein the upper surface of the monocrystalline substrate is parallel to the crystalline plane of the crystal lattice belonging to a family of crystalline planes characterized by Miller indices {111}, {110}, or {001}, wherein the crystal lattice is a cubic Bravais lattice.

8. The method according to claim 1, wherein the monocrystalline substrate further comprises, on the upper surface, a nucleation layer comprising a second Group III-nitride compound.

9. The method according to claim 1, wherein the first Group III-nitride compound is selected from AlN, GaN, InN, AlGaN, AlInN, and GaInN.

10. The method according to claim 1, wherein the first Group III-nitride compound is GaN.

11. A method of manufacturing a fin-type field effect transistor comprising:
   forming the semiconductor structure comprising the elongated structure according to the method of claim 1;
   providing, conformally on the elongated structure, a third layer comprising a third Group III-nitride compound; and
   forming, in-situ with the third layer, a fourth layer on the third layer, the fourth layer comprising a dielectric material.

12. The method according to claim 11, wherein the third layer is a stack of layers, each comprising at least a third Group III-nitride compound.

13. The method according to claim 11, wherein the first Group III-nitride compound is selected from AlN, GaN, InN, AlGaN, AlInN, and GaInN.

14. The method according to claim 11, wherein the first Group III-nitride compound is GaN.

15. A method of manufacturing a tunnel-type field effect transistor comprising:
   forming a semiconductor structure according to the method of claim 1; and
   providing, conformally on the elongated structure, a stack of layers, each comprising at least a Group III-nitride compound, wherein a bottom layer of the stack comprises an n-type III-nitride compound and a top layer of the stack comprises a p-type III-nitride compound.

16. The method according to claim 15, further comprising providing a source, a drain, and a gate to the elongated structure.

17. A method of manufacturing a light emitting device comprising:
   forming a semiconductor structure according to the method of claim 1; and
   providing, conformally on the elongated structure, a stack of layers, each comprising at least a Group III-nitride compound, wherein a bottom layer of the stack comprises an n-type III-nitride compound and a top layer of the stack comprises a p-type III-nitride compound.

18. A semiconductor structure comprising:
   a monocrystalline substrate having an upper surface covered with a masking layer comprising at least one opening exposing the upper surface; and
   a first layer, in the opening, comprising a first Group III-nitride compound, wherein the first layer extends further above the opening in the form of an elongated structure,
   wherein the at least one opening has a top surface defined by three or more straight edges forming a polygon parallel to the upper surface and oriented in such a way with respect to the crystal lattice of the monocrystalline substrate as to permit the epitaxial lateral overgrowth of the first layer in a direction perpendicular to at least one of the edges, and wherein the elongated structure is laterally elongated in the direction perpendicular to said at least one of the edges; and
   wherein the at least one of the three or more straight edges forming the polygon makes an angle of at most 10° with a crystalline plane of the crystal lattice, perpendicular to the upper surface, and belonging to a family of crystalline planes having Miller indices {1-10}.

19. A transistor, an LED array, or detector comprising the semiconductor structure according to claim 18.

* * * * *